United States Patent
Yue et al.

(10) Patent No.: US 11,757,613 B2
(45) Date of Patent: Sep. 12, 2023

(54) PAM-4 RECEIVER WITH JITTER COMPENSATION CLOCK AND DATA RECOVERY

(71) Applicant: The Hong Kong University of Science and Technology, Hong Kong (CN)

(72) Inventors: Chik Patrick Yue, Hong Kong (CN); Li Wang, Hong Kong (CN)

(73) Assignee: The Hong Kong University of Science and Technology, Hong Kong (CN)

(*) Notice: Subject to any disclaimer, the term of this patent is extended or adjusted under 35 U.S.C. 154(b) by 0 days.

(21) Appl. No.: 17/744,743

(22) Filed: May 16, 2022

(65) Prior Publication Data
US 2022/0385444 A1 Dec. 1, 2022

Related U.S. Application Data

(60) Provisional application No. 63/190,829, filed on May 20, 2021.

(51) Int. Cl.
*H03D 3/18* (2006.01)
*H03D 3/24* (2006.01)
(Continued)

(52) U.S. Cl.
CPC ............ *H04L 7/0037* (2013.01); *H03L 7/081* (2013.01); *H03L 7/0807* (2013.01);
(Continued)

(58) Field of Classification Search
CPC ..... H04L 7/0037; H04L 27/06; H04L 7/0087; H04L 43/087; H04L 25/40; H04L 7/0331;
(Continued)

(56) References Cited

U.S. PATENT DOCUMENTS 6,903,587 B2  6/2005  Sasaki et al.
7,412,016 B2 *  8/2008  Stojanovic ............ H04L 7/0331
                                                    375/360
(Continued)

FOREIGN PATENT DOCUMENTS

CN      1747327 A    3/2006
CN    105703767 A    6/2016
(Continued)

OTHER PUBLICATIONS

Junwen Zhang et al., Demonstration of Single-Carrier ETDM 400GE PAM-4 Signals Generation and Detection, IEEE Photonics Technology Letters, 2015, vol. 27 (24), p. 2543-2546.
(Continued)

*Primary Examiner* — Phuong Phu
(74) *Attorney, Agent, or Firm* — Idea Intellectual Limited; Margaret A. Burke; Sam T. Yip

(57) ABSTRACT

A PAM-4 receiver with jitter compensation clock and data recovery is provided. The receiver includes a first-order delay-locked loop (DLL) which employs a bang-bang phase detector (BBPD) and a voltage-controlled delay line (VCDL) circuit supporting 40 MHz jitter tracking bandwidth and static phase skew elimination. A second-order wideband phase-locked loop (WBPLL) using the ¼-rate reference clock provides multi-phase clock generation with low input-to-output latency. To suppress the consequent jitter transfer, a jitter compensation circuit (JCC) acquires the jitter transfer amplitude and frequency information by detecting the DLL loop filter voltage (VLF(s)) signal, and generates an inverted loop filter voltage signal, denoted as $VLF_{INV}(s)$. The $VLF_{INV}(s)$ modulates a group of complementary VCDLs (C-VCDLs) to attenuate the jitter transfer on both recovered clock and data. With the provided receiver, a jitter compensation ratio up to 60% can be
(Continued)

supported from DC to 4 MHz, with a −3-dB corner frequency of 40 MHz.

17 Claims, 19 Drawing Sheets

(51) Int. Cl.
    *H04L 7/00*       (2006.01)
    *H03L 7/081*     (2006.01)
    *H03L 7/08*       (2006.01)
    *H03L 7/089*     (2006.01)
    *H04L 27/06*     (2006.01)
    *H04L 43/087*    (2022.01)
    *H03L 7/099*     (2006.01)
    *H03M 1/46*     (2006.01)
    *H03M 7/16*     (2006.01)

(52) U.S. Cl.
    CPC .......... *H03L 7/0891* (2013.01); *H03L 7/0995* (2013.01); *H04L 7/0087* (2013.01); *H04L 27/06* (2013.01); *H04L 43/087* (2013.01); *H03M 1/46* (2013.01); *H03M 7/165* (2013.01)

(58) Field of Classification Search
    CPC ....... H04L 7/0334; H03M 1/46; H03M 7/165; H03L 7/081; H03L 7/0807; H03L 7/0891; H03L 7/0995; H03L 7/23
    USPC .......................... 375/327, 326, 371, 373–376
    See application file for complete search history.

(56) References Cited

U.S. PATENT DOCUMENTS

| | | | |
|---|---|---|---|
| 7,587,012 | B2 | 9/2009 | Evans et al. |
| 8,019,022 | B2 | 9/2011 | Liu et al. |
| 8,861,664 | B2 | 10/2014 | Akkihal et al. |
| 9,036,764 | B1 | 5/2015 | Hossain et al. |
| 9,941,864 | B2 | 4/2018 | Daghighian et al. |
| 10,135,604 | B1* | 11/2018 | Dehlaghi ............. H04L 7/0334 |
| 10,277,230 | B2 | 4/2019 | Liu et al. |
| 10,277,431 | B2* | 4/2019 | Tajalli .................. H04L 25/40 |
| 10,615,956 | B2* | 4/2020 | Kobayashi ............ H04L 27/06 |
| 10,763,866 | B2 | 9/2020 | Ryu et al. |
| 11,271,571 | B2* | 3/2022 | Tajalli ..................... H03L 7/23 |
| 2002/0075981 | A1 | 6/2002 | Tang et al. |
| 2003/0165208 | A1 | 9/2003 | Carter et al. |
| 2017/0257168 | A1 | 9/2017 | Gopalakrishnan et al. |
| 2019/0058576 | A1* | 2/2019 | Lim ...................... H04L 7/0334 |
| 2022/0329247 | A1* | 10/2022 | van Ierssel ............ H03L 7/0807 |

FOREIGN PATENT DOCUMENTS

| | | | |
|---|---|---|---|
| CN | 108282162 | A | 7/2018 |
| CN | 110034826 | A | 7/2019 |
| CN | 108880721 | B | 7/2020 |
| GB | 1424012 | A | 2/1976 |
| JP | 5061498 | B2 | 10/2012 |
| KR | 100568106 | B1 | 4/2006 |
| KR | 100605578 | B1 | 7/2006 |
| KR | 102210324 | B1 | 2/2021 |
| WO | 2017141258 | A1 | 8/2017 |
| WO | 2018192647 | A1 | 10/2018 |
| WO | 2019032085 | A1 | 2/2019 |

OTHER PUBLICATIONS

Zhuo-Kai Yang et al., High-speed Vertical-cavity Surface-emitting Lasers Based on PAM4 Modulation, Chinese Journal of Luminescence, 2020, vol. 41 (4), p. 399.
Office Action of corresponding China patent application No. 202210541372.X dated Jun. 14, 2023.
Chia-Tse Hung et al., "A 40 GB/s PAM-4 Receiver with 2-Tap DFE Based on Automatically Non-Even Level Tracking," 2018 IEEE Asian Solid-State Circuits Conference, 2018, pp. 213-214.
Po-Wei Chiu et al., "A 32Gb/s Digital-Intensive Single-Ended PAM-4 Transceiver for High-Speed Memory Interfaces Featuring a 2-Tap Time-Based Decision Feedback Equalizer and an In-Situ Channel-Loss Monitor," 2020 IEEE International Solid-State Circuits Conference, 2020, pp. 336-338.
Yang-Hang Fan et al., "A 32-GB/s Simultaneous Bidirectional Source-Synchronous Transceiver With Adaptive Echo Cancellation Techniques," IEEE Journal of Solid-State Circuits, 2019, pp. 439-451, vol. 55, No. 2.
Kunzhi Yu et al., "A 25 GB/s Hybrid-Integrated Silicon Photonic Source-Synchronous Receiver With Microring Wavelength Stabilization," IEEE Journal of Solid-State Circuits, 2016, pp. 2129-2141, vol. 51, No. 9.
Timothy O. Dickson et al., "A 1.4 pJ/bit, Power-Scalable 16x12 GB/s Source-Synchronous I/O With DFE Receiver in 32 nm SOI CMOS Technology," IEEE Journal of Solid-State Circuits, 2015, pp. 1917-1931, vol. 50, No. 8.
Hao Li et al., "A 0.8 V, 560fJ/bit, 14Gb/s Injection-Locked Receiver with Input Duty-Cycle Distortion Tolerable Edge-Rotating 5/4X Sub-Rate CDR in 65nm CMOS," 2014 Symposium on VLSI Circuits Digest of Technical Papers, 2014, pp. 1-2.
Xuqiang Zheng et al., "A 40-GB/s Quarter-Rate SerDes Transmitter and Receiver Chipset in 65-nm CMOS," IEEE Journal of Solid-State Circuits, 2017, pp. 2963-2978, vol. 52, No. 11.
Seon-Kyoo Lee et al., "A 5 GB/s Single-Ended Parallel Receiver With Adaptive Crosstalk-Induced Jitter Cancellation," IEEE Journal of Solid-State Circuits, 2013, pp. 2118-2127, vol. 48, No. 9.
James F. Buckwalter et al., "Analysis and Equalization of Data-Dependent Jitter," IEEE Journal of Solid-State Circuits, 2006, pp. 607-620, vol. 41, No. 3.

* cited by examiner

SAR-ADC

RG

CMP

PAM-4 RECEIVER WITH JITTER COMPENSATION CLOCK AND DATA RECOVERY

CROSS-REFERENCE TO RELATED APPLICATIONS

The present application claims priority to U.S. Provisional Patent Application No. 63/190,829 filed May 20, 2021, and the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention generally relates to jitter compensation clock and data recovery, and more specifically, to a four-level pulse amplitude modulation (PAM-4) receiver with jitter compensation clock and data recovery.

BACKGROUND OF THE INVENTION

Driven by the proliferation of data intensive applications such as 5G communications, cloud services, autonomous vehicles, deep neural networks and 8K display panels, high speed and low power data movements from processors to processors and from processors to off-chip memories become crucial problems in high-performance computing systems. The explosive rise in processor I/O bandwidth demands for massive low-power links with advanced signaling schemes such as four-level pulse amplitude modulation (PAM-4). As the data rate reaches over 50 Gb/s/lane with PAM-4 signaling, the signal quality is getting increasingly susceptible to jitter generated from both channel and circuits. Therefore, the clock distribution circuit requires extra design efforts to handle the jitter issues and ensure robust system synchronization.

Source synchronous I/O is an attractive technique in chip-to-chip interconnections due to its low latency and high reliability in frequency recovery, wide jitter tolerance bandwidth and implementation simplicity. A widely adopted source synchronous I/O architecture consisting of a differential clock lane and a differential data lane is shown in FIG. 1A. In the clock lane, after the clock signal is transmitted from the transmitter (Tx) through the channel, a buffer (Buf) with a duty cycle correction (DCC) block reproduce a high-quality clock for data signal sampling. An injection-locked oscillator (IJO) or a multi-phase phase-locked loop (MPLL) use the reproduced clock as reference and generate the four or eight phase (4-PH/8-PH) clocks. A phase interpolator (PI) generates the final sampling clocks by interpolating among the multi-phase clocks to synchronize the decoder and deserialization blocks.

In order to achieve robust synchronization, several jitter and phase skew related issues need to be carefully handled in the clock distribution circuit. First, the data phase and clock phase are typically precisely aligned at the transmitter outputs in source synchronous I/Os. The correlated jitter between clock and data can be properly accommodated by the wideband MPLL or IJO. However, the difference in latencies between the data and clock lanes cause a phase skew between the equalized data and reproduced clock from Buf and DCC. The unfolded phase skew induced by the delays from channels, equalizer (EQ), Buf, DCC, IJO/MPLL and PI can reach several UIs. Second, except from phase skew, uncorrelated jitter exists between data and clock. For electrical interconnections, the uncorrelated jitter originates from ground and supply noises, temperature drift, front-end circuit flicker noises, channel coupling and electro-magnetic interference (EMI). For optical interconnections, the uncorrelated jitter is mainly due to the noises of photo detector and front-end circuit. Third, even though these uncorrelated jitters are sufficiently tracked, the jitter transfer on the recovered clock signal $CLK_{REC}$ and data signal $DATA_{REC}$ can still cause error when synchronized to the local clock on the following digital processing systems. For massively parallel communication, the uncorrelated jitters are different from lane to lane, which also induce synchronization challenges.

Various solutions have been reported against the previously mentioned challenges. For example, a delay-locked loop (DLL) can be employed for multi-phase clock generation and a PI with coarse and fine phase selection to eliminate the skew between clock and data. To avoid the multi-phase clock mismatch produced by the DLL due to the voltage-controlled delay line (VCDL) asymmetry, an IJO could be used for global I/Q phase generation with better phase matching using proper dummy and frequency calibration techniques, which was followed by a PI or a local IJO for phase skew elimination. Digital-controlled delay line in data path or IJO in clock path could also be employed as deskew methods for parallel optical interconnections with source synchronous clocking scheme. Although the above-said methods properly handled the static phase skew induced by the differences in lane latencies, the uncorrelated jitter between data and clock remained untracked. The narrow jitter tolerance amplitude and bandwidth could stress the decoding circuit.

On the other hand, various techniques such as time-to-time phase update, clock and data alignment (CDA) and clock and data recovery (CDR) had been proposed to support sufficient jitter tracking as shown in FIG. 1B. A current integration-based phase rotator was used to handle both static phase skew and jitter, by updating the synchronization clock phase every 50 ms. The equivalent 20-Hz bandwidth could track the jitter caused by slow power and temperature drifts. Similar function was support in employing a 128-Hz CDR loop with alexander phase detector. Low bandwidth CDA loops with bang-bang type phase detectors and PIs could be used to adjust the sampling phases in background. A 1-MHz baud-rate CDR, a 4-MHz baud-rate CDR and a 5~10-MHz dual path CDR using PIs were presented respectively (The CDR bandwidths are read from jitter tolerance measurement results). However, so far, the reported jitter tolerance bandwidths had been limited to below 20 MHz, and the undesirable jitter transfers on the $CLK_{REC}$ and $DATA_{REC}$ remain as challenges.

Jitter tolerance and jitter transfer decoupling techniques can be used to support wide jitter tolerance bandwidth with suppressed jitter transfer to the recovered clock and data of each lane. A dual-loop configuration consisting of a wide-band DLL and narrow-band PLL was proposed to achieve jitter tolerance and jitter transfer bandwidth decoupling. A low-pass loop filter with adjustable loop bandwidth for data and edge samplings was demonstrated to achieve a wide 20-MHz jitter tolerance bandwidth with a narrow 4-MHz jitter transfer bandwidth, under 40-Gb/s ¼-rate receiver (Rx) architecture. Nonetheless, the previously reported methods could only narrow the jitter transfer bandwidth down to a few MHz, not enough to sufficiently filter out lower frequency jitters from power and ground noises, temperature drift and CMOS device flicker noise. In addition, the jitter tolerance and jitter transfer decoupling technique had only been implemented with non-return-to-zero (NRZ) Rx architecture at data rate below 50 Gb/s.

FIG. 2 shows a conventional CDR architecture for comparison. As shown in FIG. 2, jitter Φin(s) and static phase on the input signal is converted proportionally to the loop filter voltage VLF(s) through the bang-bang phase detector (BBPD) and charge pump (CP). The VLF(s) modulates the VCDL to generate the recovered clock $CLK_{REC}$, which then samples and decodes the input NRZ signal to produce the recovered data $DATA_{REC}$. Therefore, the input jitter within DLL bandwidth is transferred directly to both $CLK_{REC}$ and $DATA_{REC}$.

SUMMARY OF THE INVENTION

To solve the above-mentioned challenges, the present invention provides a source synchronous 60-Gb/s ¼-rate PAM-4 receiver with a jitter compensation CDR (JCCDR) in 40-nm CMOS technology, achieving a wide jitter tolerance bandwidth (40-MHz) and an ultralow jitter transfer (<−8-dB).

According to one aspect of the present invention, the provided PAM-4 receiver includes a first-order delay-locked loop (DLL) which employs a bang-bang phase detector (BBPD) and a voltage-controlled delay line (VCDL) circuit supporting 40 MHz jitter tracking bandwidth and static phase skew elimination. A second-order wideband phase-locked loop (WBPLL) using the ¼-rate reference clock provides multi-phase clock generation and ensure a sufficiently low input-to-output latency. To suppress the consequent jitter transfer, a jitter compensation circuit (JCC) acquires the jitter transfer amplitude and frequency information by detecting the DLL loop filter voltage (VLF(s)) signal, and generates an inverted loop filter voltage signal, denoted as $VLF_{INV}(s)$. The $VLF_{INV}(S)$ modulates a group of complementary VCDLs (C-VCDLs) to attenuate the jitter transfer on both recovered clock and data.

With the provided PAM-4 receiver, a jitter compensation ratio up to 60% can be supported from DC to 4 MHz, with a −3-dB cornerfrequency of 40 MHz. Therefore, the present invention provides a solution to the three challenges in source synchronous I/O, including clock phase deskew, wideband jitter tolerance and jitter transfer attenuation.

BRIEF DESCRIPTION OF THE DRAWINGS

Aspects of the present disclosure may be readily understood from the following detailed description with reference to the accompanying figures. The illustrations may not necessarily be drawn to scale. That is, the dimensions of the various features may be arbitrarily increased or reduced for clarity of discussion. There may be distinctions between the artistic renditions in the present disclosure and the actual apparatus due to manufacturing processes and tolerances. Common reference numerals may be used throughout the drawings and the detailed description to indicate the same or similar components.

DETAILED DESCRIPTION

In the following description, preferred examples of the present disclosure will be set forth as embodiments which are to be regarded as illustrative rather than restrictive. Specific details may be omitted so as not to obscure the present disclosure; however, the disclosure is written to enable one skilled in the art to practice the teachings herein without undue experimentation.

Figure 1A:
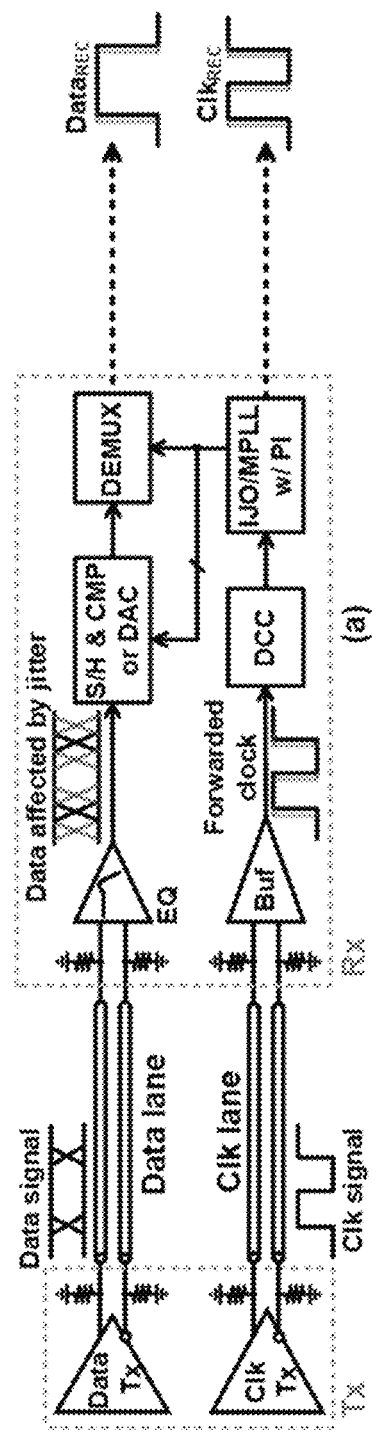
FIG. 1A shows a conventional source synchronous I/O architecture.
Figure 1B:
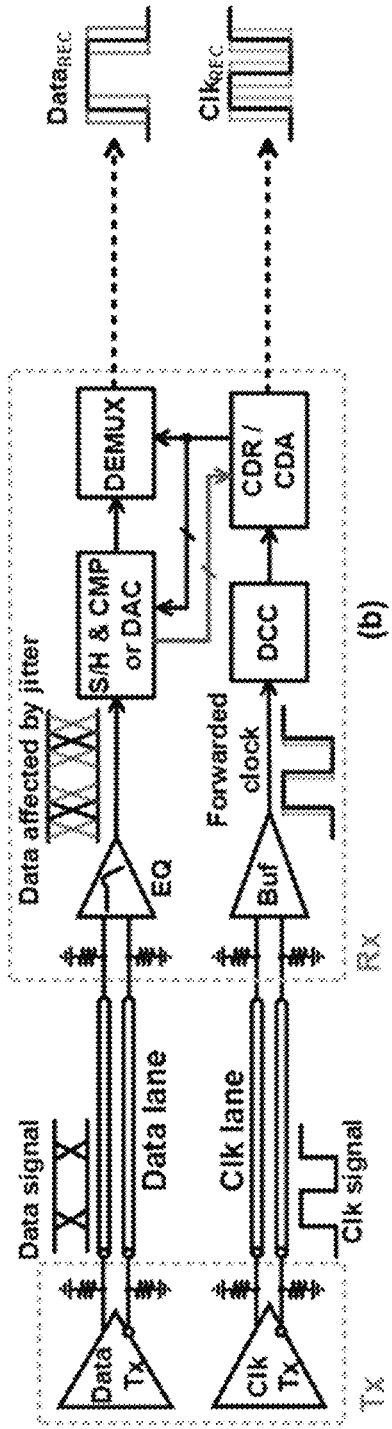
FIG. 1B shows a conventional clock and data recovery (CDR) architecture supporting jitter tracking.
Figure 2:
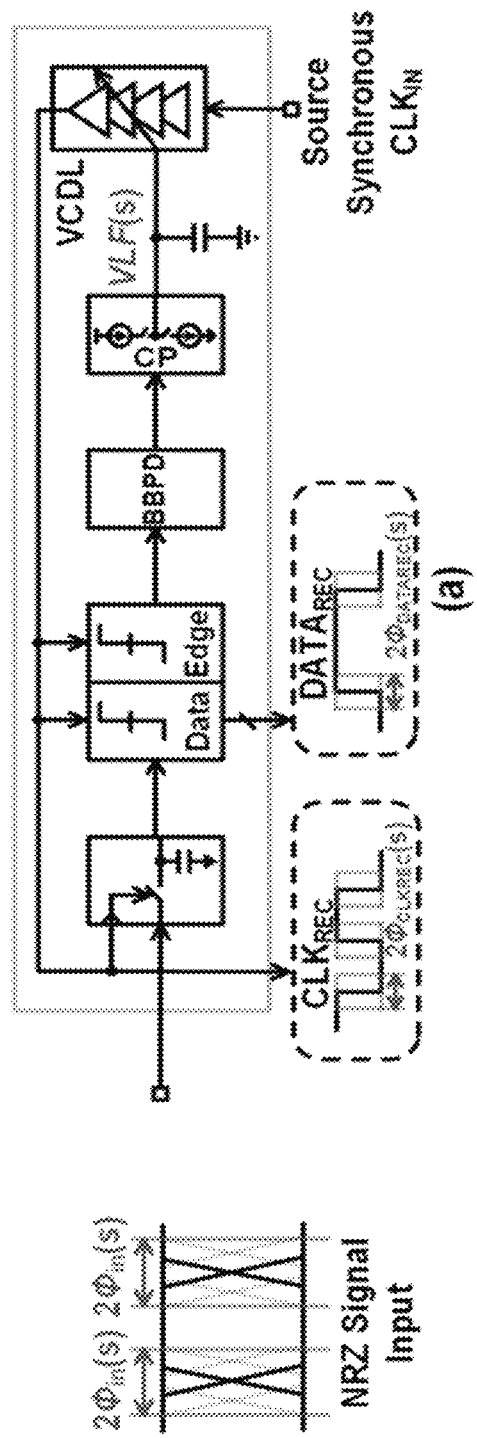
FIG. 2 shows another conventional CDR architecture.
Figure 3:
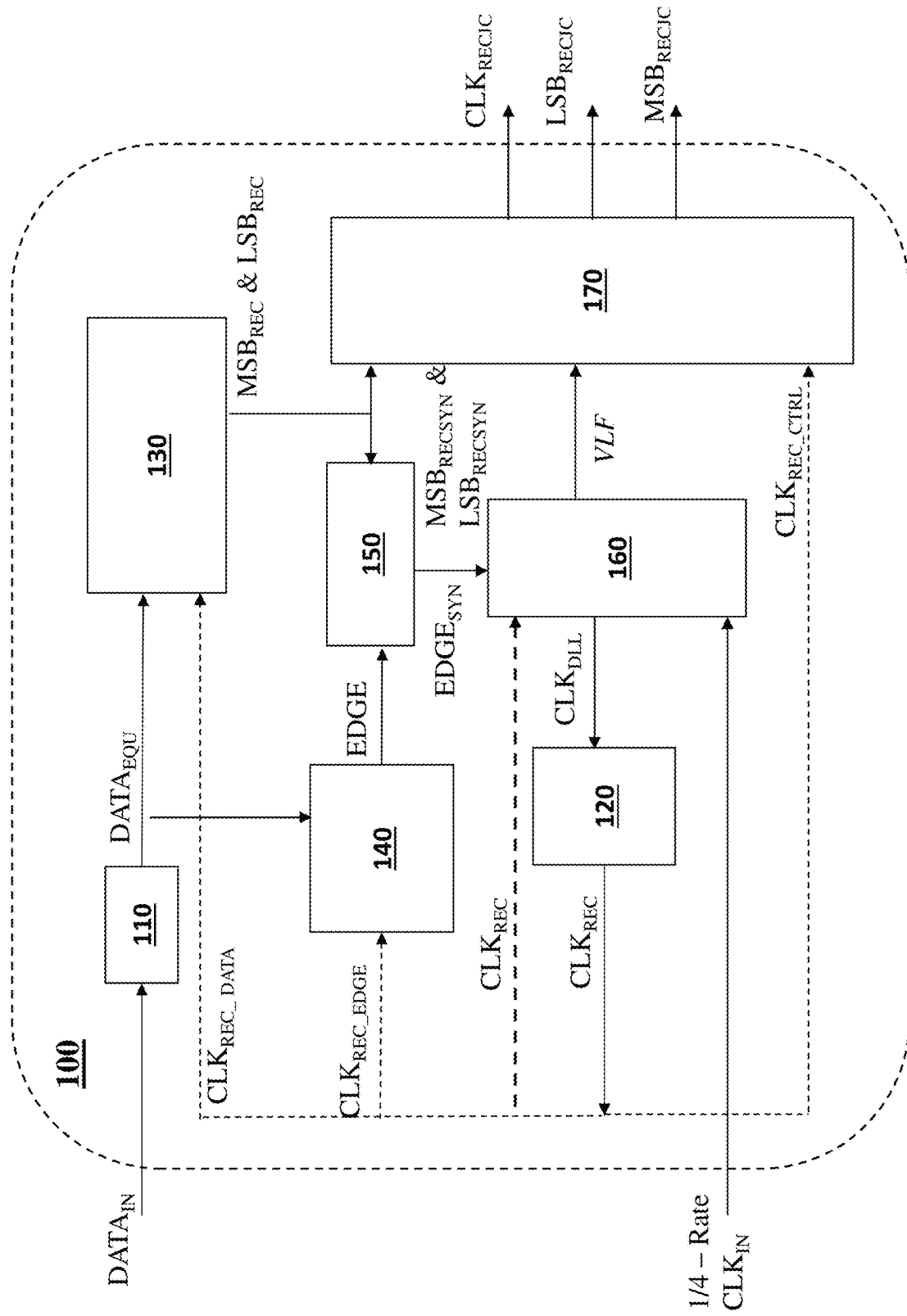
FIG. 3 shows a circuit block diagram of a PAM-4 receiver with jitter compensation clock and data recovery (JCCDR) according to some embodiments of the present invention.

FIG. 3 is a circuit block diagram of a PAM-4 receiver 100 with jitter compensation clock and data recovery (JCCDR) according to some embodiments of the present invention. As shown, the PAM-4 receiver 100 may comprise a two-stage continuous-time linear equalizer (CTLE) 110, a wide-band phase-locked loop (WBPLL) 120, a data decoder 130, an edge detector 140, a retimer 150, a delay-locked loop (DLL) 160, and a jitter compensation circuit (JCC) 170.

Figure 4:
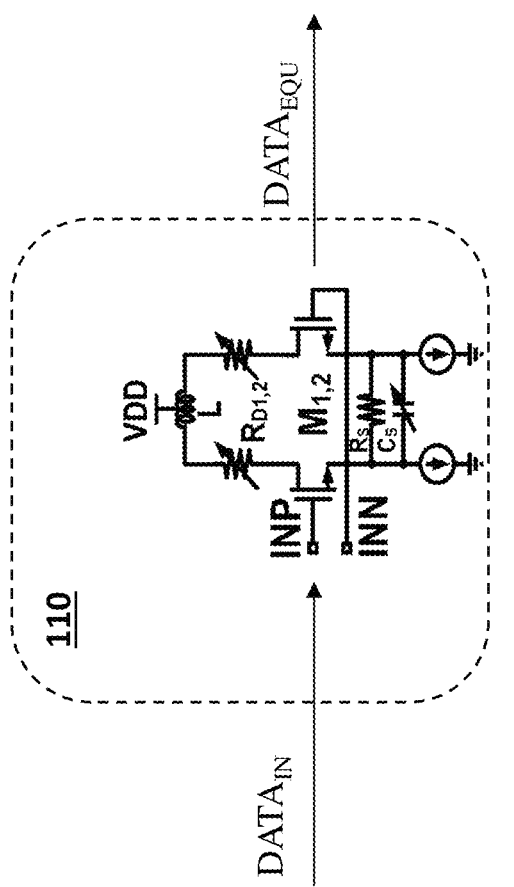
FIG. 4 shows an exemplary circuit diagram for a continuous-time linear equalizer (CTLE) according to some embodiments of the present invention.

The CTLE 110 is implemented as a front-end of the receiver 100 to compensate for moderate channel loss and configured to equalize an PAM4 input data signal ($DATA_{IN}$). Referring to FIG. 4, in some embodiments, the CTLE 110 may have a R-C source degeneration and inductor shunt peaking architecture including a differential shunting peaking inductor L, a pair of drain resistors $R_{D1,2}$, a degeneration capacitor (or source capacitor) Cs and a degeneration resistor (or source resistor) Rs. In some embodiments, the degeneration capacitor Cs and the drain resistors $R_{D1,2}$ are adjustable to achieve a 2.5~11-dB peaking and 4-dB gain tuning range.

Referring back to FIG. 3. The WBPLL 120 may be configured to receive and lock to a quarter-rate delay-locked clock signal $CLK_{DLL}$ to generate a plurality of sampling clock signals $CLK_{REC}$ with evenly separated phases. The plurality of sampling clock signals $CLK_{REC}$ may include N data-sampling clock signals $CLK_{REC\_DATA}$ with phases separated by 360°/N, where N is a positive even integer. The plurality of sampling clock signals $CLK_{REC}$ may further include N/2 edge-sampling clock signals $CLK_{REC\_EDGE}$ with phases separated by 360°/(N/2) interleaving with the N data-sampling clock signals. For example, the plurality of sampling clock signals may include 4 data-sampling clock signals with phases separated by 90° (e.g., clock signals at phases 0°, 90°, 180° and 270°, denoted as $CLK_{REC,PH-0}$, $CLK_{REC,PH-90}$, $CLK_{REC,PH-180}$ and $CLK_{REC,PH-270}$, respectively) and 2 edge-sampling clock signals with phases separated by 180° (e.g., clock signals at phases 45° and 225°, denoted as $CLK_{REC,PH-45}$ and $CLK_{REC,PH-225}$, respectively).

Figure 5A:
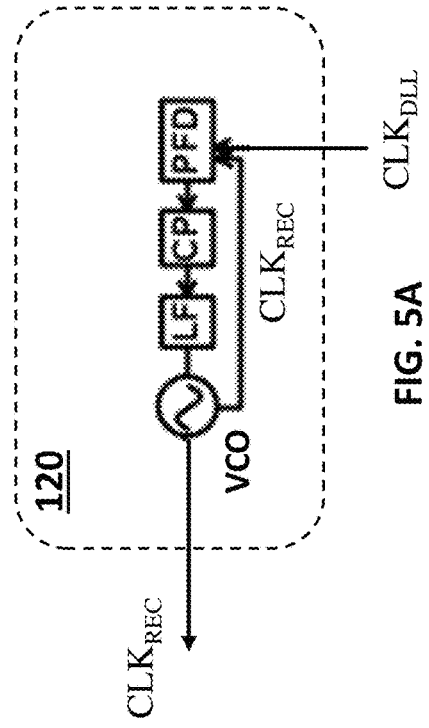
FIG. 5A shows an exemplary circuit diagram for a wide-band phase-locked loop (WBPLL) according to some embodiments of the present invention.

Referring to FIG. 5A, in some embodiments, the WBPLL 120 may comprise a voltage-controlled oscillator (VCO) configured to generate the plurality of sampling clock signals $CLK_{REC}$ based on an oscillator control voltage signal; a phase frequency detector (PFD) configured to detect a phase difference of the generated sampling clock signals ($CLK_{REC}$) with reference to the delay-locked clock signal ($CLK_{DLL}$), and produce a phase difference signal; a charge pump (CP) and a loop filter (LF) configured to convert the phase difference signal to the oscillator control voltage signal.

In some embodiments, the phase difference detection may be realized with a XOR phase detector which produces a high voltage level signal when the states of $CLK_{REC}$ and $CLK_{DLL}$ are different from each other, and a low voltage level signal (typically equal to 0 V) when the states of $CLK_{REC}$ and $CLK_{DLL}$ are the same with each other.

Figure 5B:
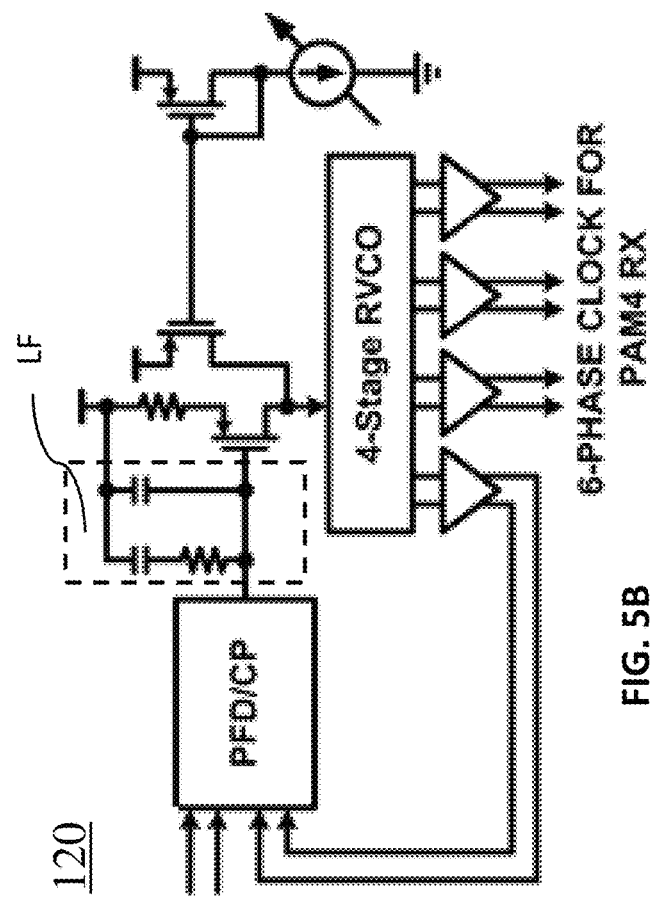
FIG. 5B shows a more detailed exemplary circuit diagram for the wide-band phase-locked loop (WBPLL)

Referring to FIG. 5B, in some embodiments, the VCO may be a multi-stage ring oscillator including one or more (e.g., four) delay cells with an adjustable external current source for frequency control. Compared with other multi-phase clock generation techniques such as IJO and DLL, the WBPLL causes minor phase mismatch due to the intrinsic symmetry of the ring oscillator. The WBPLL uses the synchronous ¼-rate reference clock and produces 8-PH output clocks with the same frequency as input. Thanks to the high frequency reference clock, the WBPLL can support a wide loop bandwidth without stability issue, which benefits faster locking, higher ring oscillator phase noise suppression, and lower VCO power consumption In some implementations, the output clock frequency of the WBPLL may have a tuning range from 3.75 to 7.5 GHz to support 30-to-60-Gb/s PAM-4 operation. The WBPLL bandwidth is set at 400 MHz to ensure its phase and frequency updates can settle much faster than the quarter-rate delay-locked clock signal $CLK_{DLL}$, whose bandwidth is designed to be 40 MHz for good jitter tolerance. The 400-MHz PLL bandwidth also supports wideband correlated jitter tracking and pattern-dependent uncorrelated jitter filtering.

Referring back to FIG. 3. The data decoder 130 may be configured to decode the equalized data signal $DATA_{EQU}$ with the N data-sampling clock signals $CLK_{REC\_DATA}$ (e.g., $CLK_{REC,PH-0/90/180/270}$) to recover a most significant bit (MSB) signal ($MSB_{REC}$) and a least significant bit (LSB) signal ($LSB_{REC}$).

Figure 6:
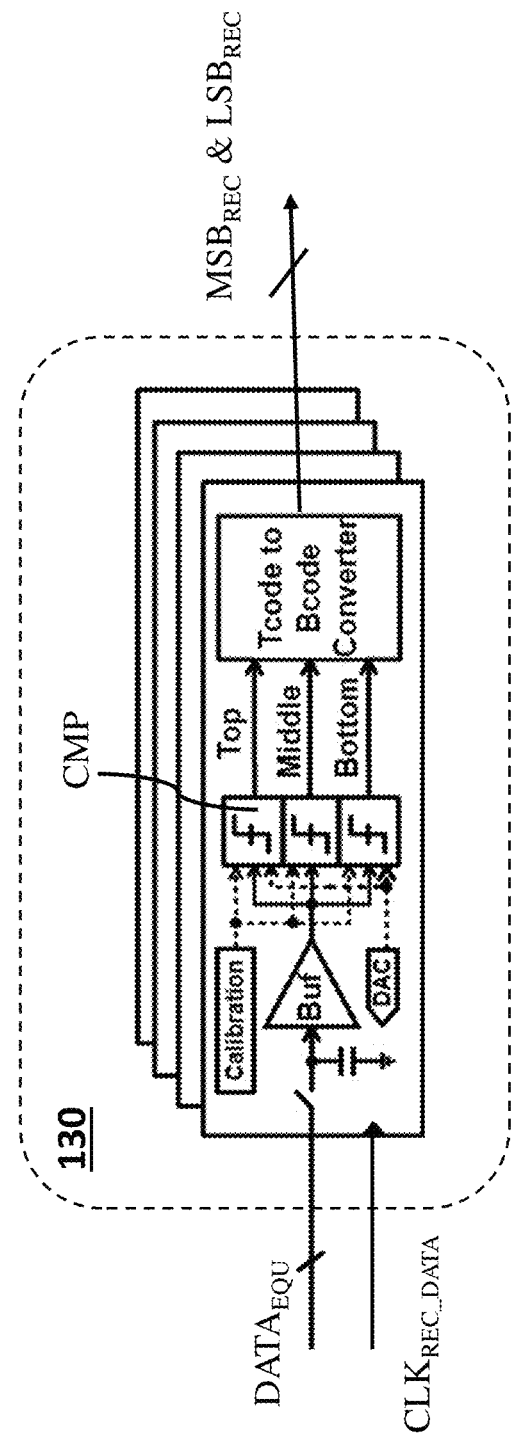
FIG. 6 shows an exemplary circuit diagram for a data decoder according to some embodiments of the present invention.

Referring to FIG. 6, in some embodiments, the data decoder 130 may include: a calibration circuit configured to calibrate voltage offsets at the PAM4 input data signal; N sample-and-hold (S/H) circuits (not shown) configured to sample the equalized data signal $DATA_{EQU}$ with the N data-sampling clock signals $CLK_{REC}$_DATA to obtain N data samples respectively; a digital-to-analog converter (DAC) configured to generate three decision threshold voltage levels; a 3-level slicer circuit, which may include three StrongARM comparators (CMP), configured to demodulate each of the N data samples into a thermometer coded bit stream by comparing each of the N data samples with the three decision threshold voltage levels; and a coding converter configured to convert the thermometer coded bit stream to a binary coded bit stream including a MSB bit stream constituting the recovered MSB signal ($MSB_{REC}$) and a LSB bit stream constituting the recovered LSB signal ($LSB_{REC}$).

For example, the input PAM-4 signal may be sampled and deserialized by four S/H circuits with the PH-0/90/180/270 $CLK_{REC}$ signals. Next, the sampled signals are decoded using the three StrongARM CMP with individual reference voltages generated from a 6-bit current-mode DAC for slicing the top, middle, and bottom data eyes. The offsets at the input MOSFET devices of the StrongARM CMPs are calibrated upon startup using a 6-bit DAC as the calibration circuit. The decoded 4×3-bit thermometer codes (Tcode) are then converted into 4×2-bit binary codes (Bcode) as $MSB_{REC}$ and $LSB_{REC}$.

Referring back to FIG. 3. The edge detector 140 may be configured to detect edge information of the equalized data signal $DATA_{EQU}$ with the N/2 edge-sampling clock signals $CLK_{REC\_EDGE}$ to generate an edge information signal EDGE.

Figure 7:
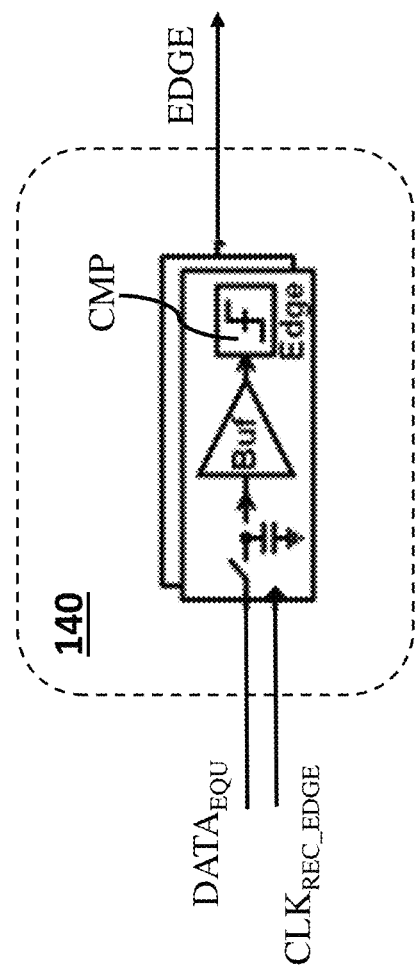
FIG. 7 shows an exemplary circuit diagram for an edge detector according to some embodiments of the present invention.

Referring to FIG. 7, in some embodiments, the edge detector 140 may comprise N/2 S/H circuits configured to sample edges on the equalized data signal $DATA_{EQU}$ with the N/2 edge-sampling clock signals $CLK_{REC\_EDGE}$ to obtain N/2 edge information samples; and a comparator (CMP) configured to generate the edge information signal by comparing each of the N/2 edge information samples with a decision threshold voltage level. For example, the PAM-4 signal edge information may be detected by two additional S/Hs and CMPs clocked by PH-45/225 $CLK_{REC}$ signals.

Figure 8:
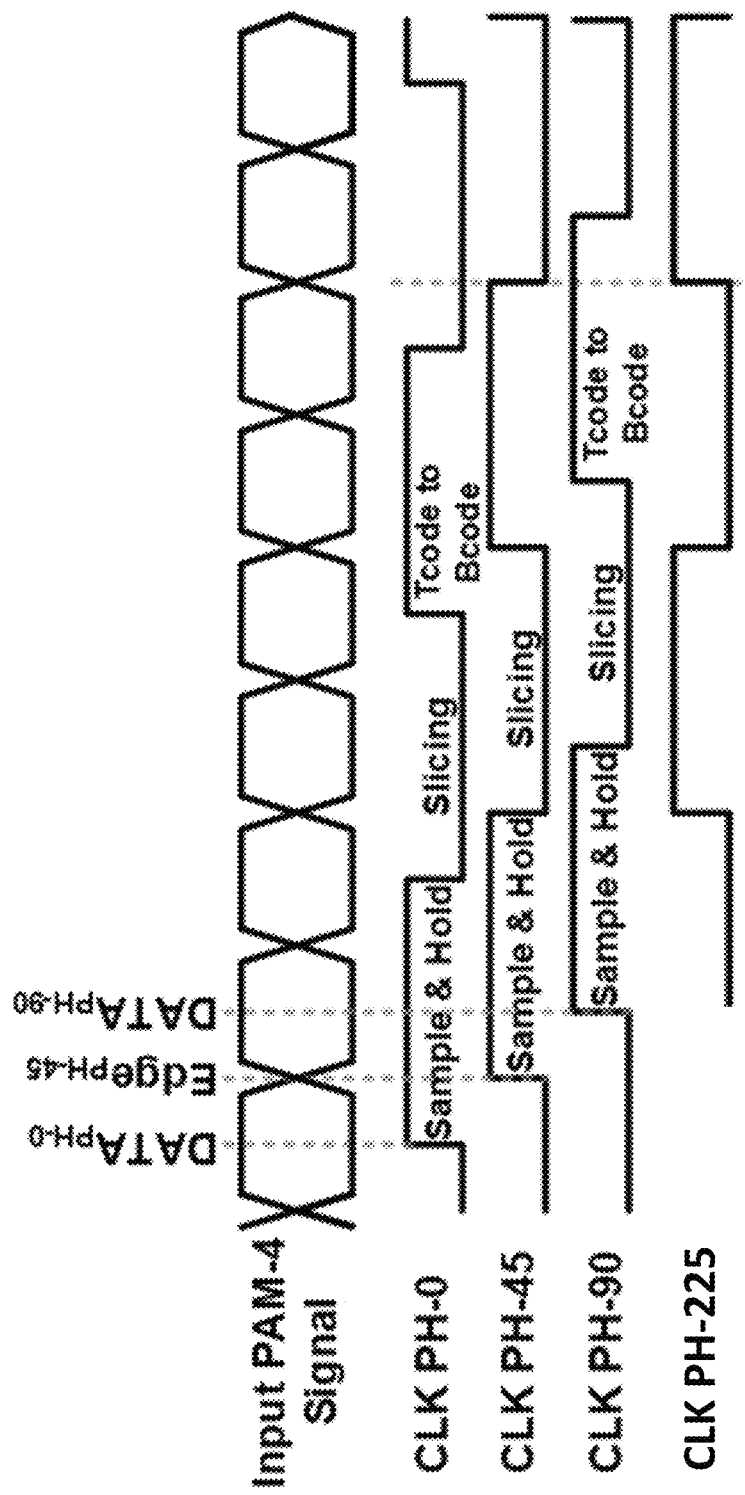
FIG. 8 shows timing diagram for decoding the data signals at clock PH-0, 90 and edge signal at clock PH-45 according to some embodiments of the present invention.

FIG. 8 shows timing diagram for decoding the data signals at clock PH-0, 90 and edge signal at clock PH-45. The same timing sequence applies to data and edge decoding on clock PH-180, 270 and 225. At the first rising edges of PH-0, 90 and 45, the data and edge signals are sampled and held on sampling capacitors. On the following falling edges, the data and edge signals are decoded using CMPs with three reference levels. The decoded data signals are in the Tcode format, which are converted into Bcode format at the second clock rising edges. The decoded data and edge information are synchronized by clock PH-225, and then sent to the DLL 160 for phase detection.

Referring back to FIG. 3. The retimer 150 may be configured to synchronize the recovered data signal (i.e., the recovered MSB and LSB signals, $MSB_{REC}$ and $LSB_{REC}$) and the recovered edge information signal EDGE.

Figure 9:
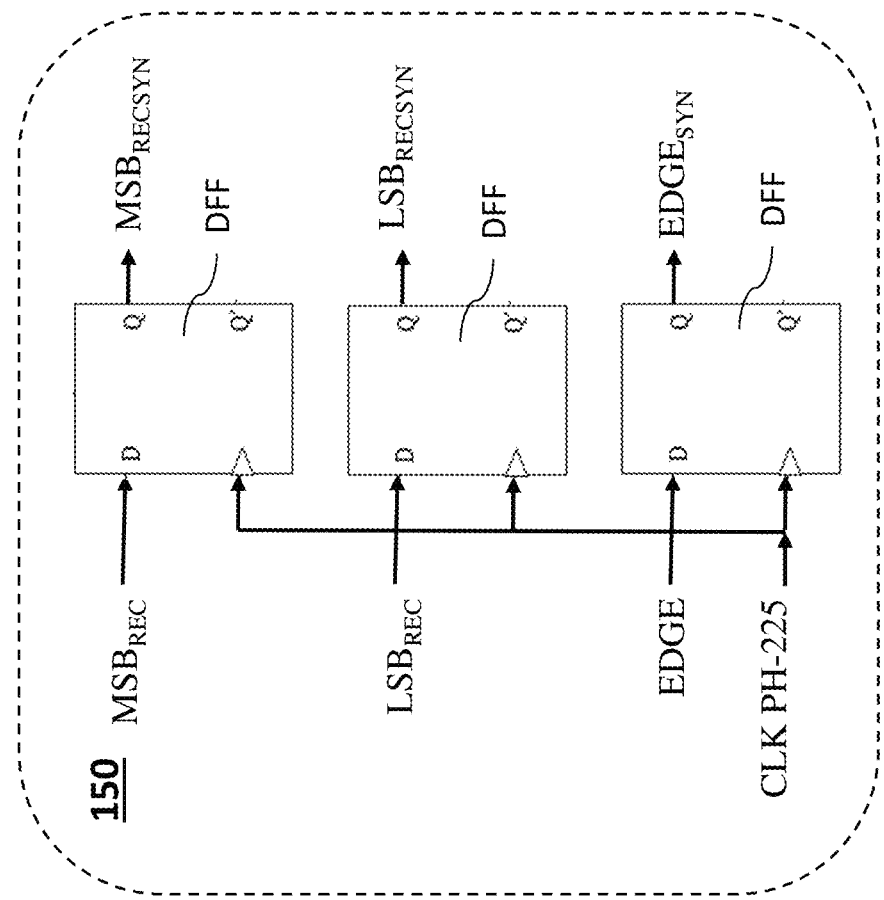
FIG. 9 shows an exemplary circuit diagram for a retimer according to some embodiments of the present invention.

Referring to FIG. 9, in some embodiments, the retimer 150 may comprise one or more D-type flip-flop (DFF) retiming circuits. The DFFs are configured to be synchronized by a single clock (e.g., CLK PH-225) to generate synchronized $MSB_{RECSYN}$, $LSB_{RECSYN}$ and $EDGE_{SYN}$, respectively.

Referring back to FIG. 3. The DLL 160 may be configured to: detect a phase skew of the input PAM-4 signal with reference to the sampling clock signals $CLK_{REC}$, produce a delay-line control voltage signal VLF(s) based on the detected phase skew, and generate a delay-locked clock signal $CLK_{DLL}$ based on the delay-line control voltage signal VLF.

The delay-line control voltage signal VLF(s) consists of a DC component $VLF_{DC}$ for fixing the locked timing point and an AC component $VLF_{AC}$ for tracking high-frequency jitter. Typically, the $VLF_{DC}$ varies from 0.15 V to 0.85 V, while $VLF_{AC}$ exhibits an amplitude of tens of mV and a bandwidth within 40 MHz.

Figure 10:
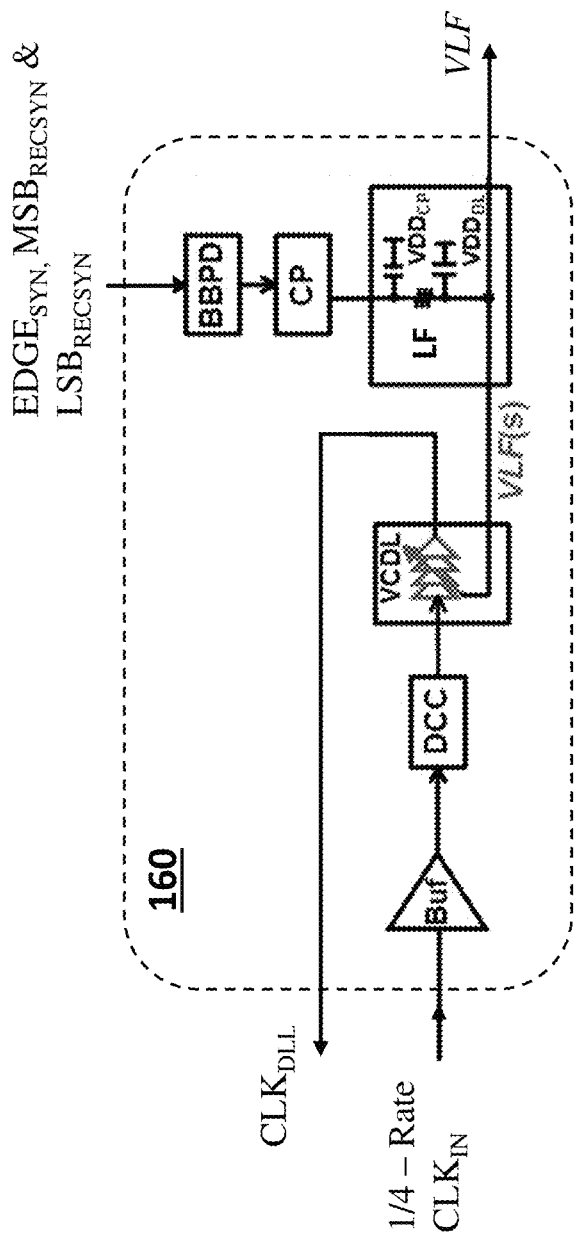
FIG. 10 shows an exemplary circuit diagram for a delay-locked loop (DLL) according to some embodiments of the present invention.

Referring to FIG. 10, in some embodiments, the DLL 160 may comprise a bang-bang phase detector (BBPD) configured to detect the phase skew of the input PAM-4 signal with reference to the sampling clock signals $CLK_{REC}$ to generate the phase skew signal; a charge pump (CP) and a capacitor-resistor-capacitor (C-R-C) loop filter (LF) configured to convert the phase skew signal to the delay-line control voltage signal VLF; and a voltage-controlled delay line (VCDL) circuit configured to generate the delay-locked clock signal $CLK_{DLL}$ based on the delay-line control voltage signal VLF(s) and the input clock signal $CLK_{IN}$.

In some implementations, the CP may have an output current of 50~100 uA. Since the on-off switching of CP current can cause a relatively large supply variation, the C-R-C loop filter decouples the variation on CP power supply and VCDL power supply. The VLF(s) regulates the VCDL to generate the $CLK_{DLL}$, which tracks the jitter from the input PAM-4 signal.

The DLL 160 may further comprise a buffer (Buf) circuit and a duty cycle correction (DCC) circuit configured to correct duty cycles of the input clock signal $CLK_{IN}$ and convert the input clock signal from a single-ended clock signal to a differential clock signal.

Figure 11:
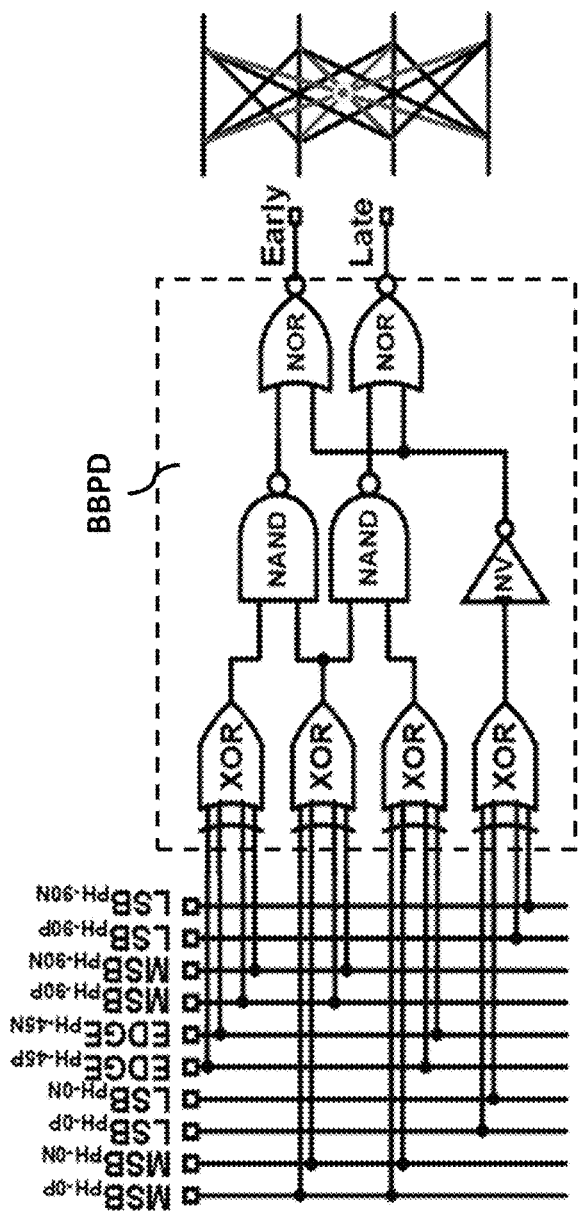
FIG. 11 shows an exemplary bang band phase detector (BBPD) logic circuit used for receiving clock signals at phases PH-0, 45 and 90 and a corresponding transition diagram of its early/late indication signal.

FIG. 11 shows an exemplary BBPD logic circuit used for receiving clock signals at phases PH-0, 45 and 90 and a corresponding transition diagram of its early/late indication signal. The same circuit is also employed for PH-180, 225 and 270. As shown, the BBPD only produces the Late and Early signals when the MSB and LSB data on the rising edges of two consecutive clock cycle are both different from each other. For example, the BBPD may produce a 1-bit clock early/late indication signal as the phase skew signal by comparing the states of two consecutive $MSB_{REC}$, $LSB_{REC}$ signals and one EDGE signal in between; When the state of $MSB_{REC}/LSB_{REC}$-EDGE-$MSB_{REC}/LSB_{REC}$ is 1/1-0-0/0 or 0/0-1-1/1, a clock early information is produced. When the state $MSB_{REC}/LSB_{REC}$-EDGE-$MSB_{REC}/LSB_{REC}$ is 1/1-1-0/0 or 0/0-0-1/1, a clock late information is produced. Other states are filtered out and not adopted for phase detection.

Figure 12:
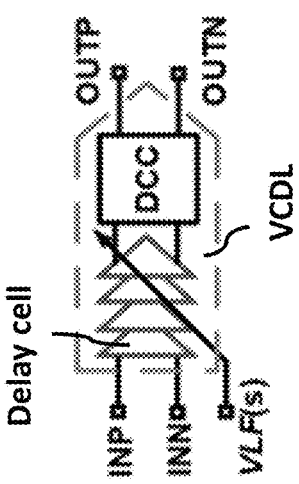
FIG. 12 shows an exemplary circuit diagram for a voltage-controlled delay line (VCDL) circuit according to some embodiments of the present invention.

Referring to FIG. 12, in some embodiments, the VCDL circuit may include one or more voltage-controlled delay cells to produce a delay time proportional to the detected phase skew to generate the delay-locked clock signal $CLK_{DLL}$; and a duty cycle correction (DCC) block comprising a cross coupled PMOS pair for correcting duty cycle.

Figure 13:
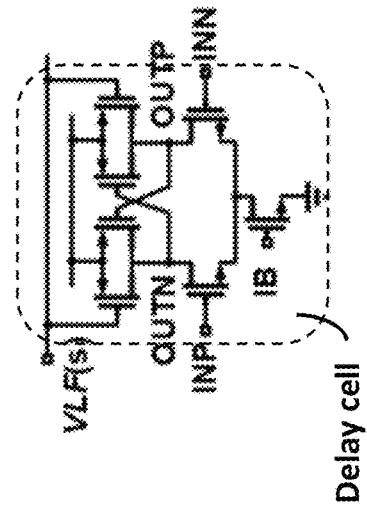
FIG. 13 shows an exemplary circuit diagram for a voltage-controlled delay cell according to some embodiments of the present invention.

Referring to FIG. 13, in some embodiments, each of the voltage-controlled delay cells may consist of a pair of NMOSs as input devices and a pair of PMOSs as output devices to produce a delayed output signal, that is the delay-locked clock signal $CLK_{DLL}$, which has a delay time proportional to the delay-line control voltage signal VLF(s) with reference to the input clock signal $CLK_{IN}$.

Referring back to FIG. 3. The jitter compensation circuit JCC 170 may be configured to compensate jitter transfer from the PAM4 input data signal with an inverted delay-line control voltage signal $VLF_{INV}(s)$ to generate a jitter-compensated recovered clock signal $CLK_{RECJC}$, jitter-compensated recovered LSB signal $LSB_{RECJC}$ and jitter-compensated recovered MSB signal $MSB_{RECJC}$.

Figure 14:
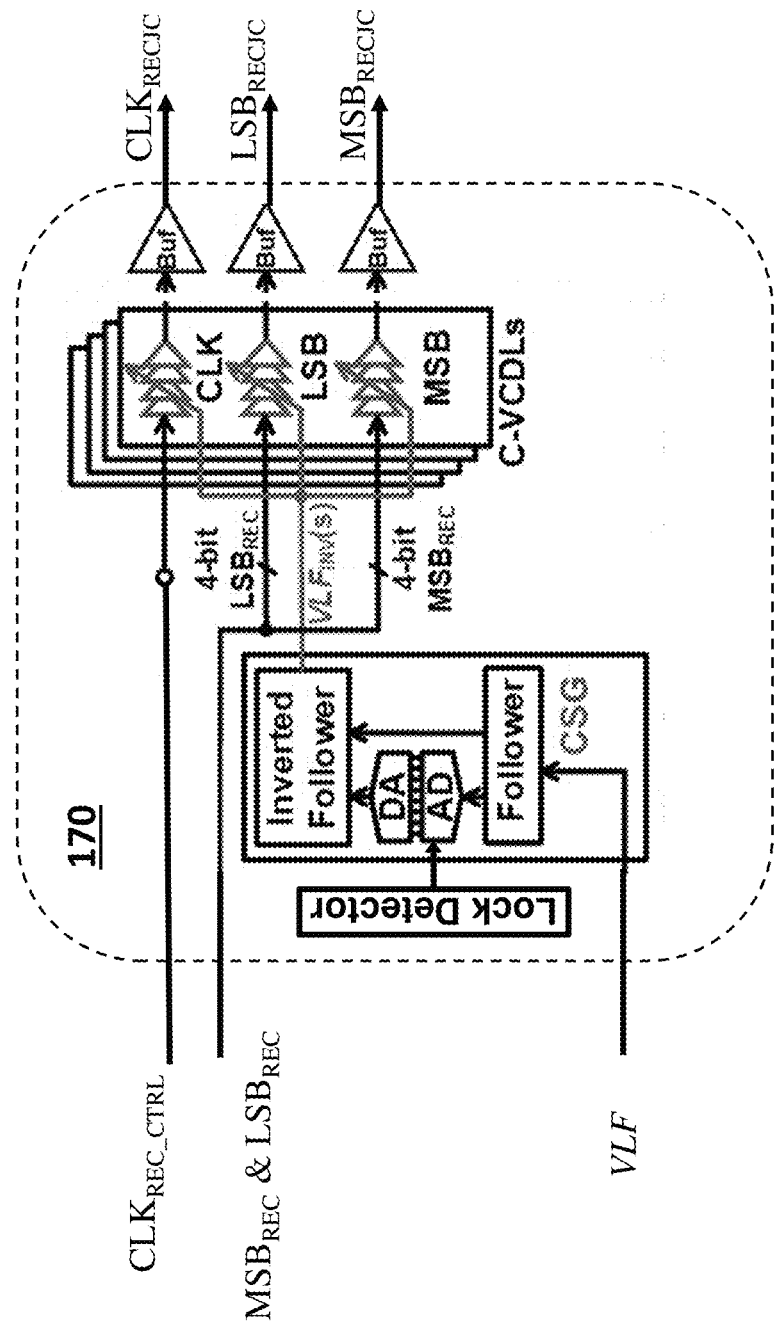
FIG. 14 shows an exemplary circuit diagram for a jitter compensation circuit (JCC) according to some embodiments of the present invention.

Referring to FIG. 14, in some embodiments, the JCC 170 may comprise a lock detector; a complementary signal generator (CSG) configured to convert the delay-line control voltage signal to the inverted delay-line control voltage signal $VLF_{INV}$; and a plurality of complementary VCDL (C-VCDL) circuits. The inverted delay-line control voltage signal $VLF_{INV}(s)$ produced by the CSG may have the same DC level and AC amplitude as the delay-line control voltage signal VLF(s) but opposite AC phase. The DC level of $VLF_{INV}(s)$, denoted as $VLF_{INVDC}$, is fixed close to $VLF_{DC}$ with a negligible error caused by the insufficient gain of the core AMP and the ADC nonlinearity.

Figure 15:
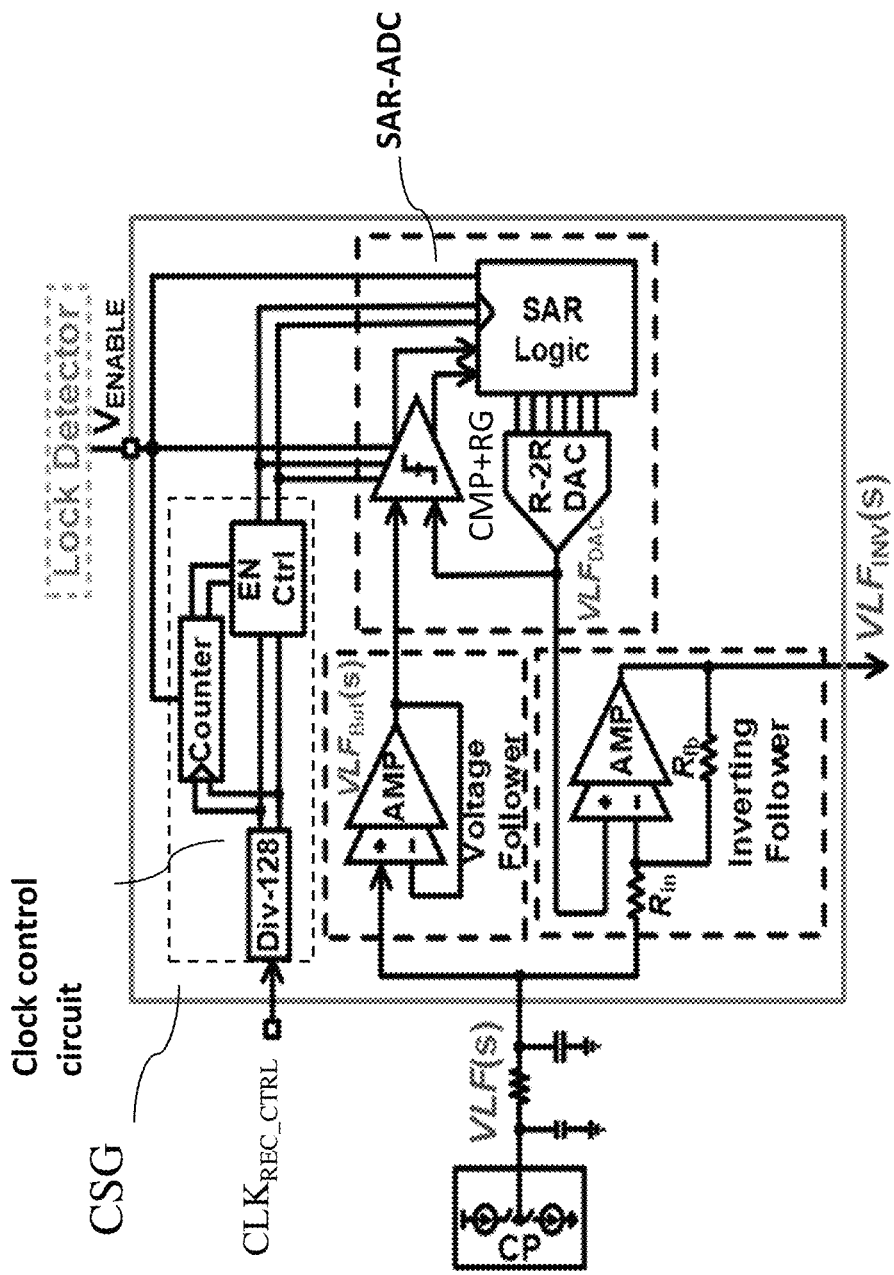
FIG. 15 shows an exemplary circuit diagram for a complementary signal generator (CSG) according to some embodiments of the present invention.

Referring to FIG. 15, in some embodiments, the CSG may include a clock control unit configured to divide a control clock signal $CLK_{REC, CTRL}$ (e.g., a clock signal at PH-135) by a suitable number of times (e.g., 128 times); a voltage follower configured to buffer the delay-line control voltage signal VLF(s) to produce a buffered delay-line control voltage signal $VLF_{Buf}(s)$; a successive approximation register (SAR) analog-to-digital converter (ADC) synchronized with the divided control clock signal and configured to quantize the buffered delay-line control voltage signal $VLF_{Buf}(s)$ to obtain a DC level and produce an analog delay-line control voltage $VLF_{DAC}$ for tracking the DC level; and an inverting follower configured to receive the analog delay-line control voltage $VLF_{DAC}$ and the delay-line control voltage signal VLF(s) to produce the inverted delay-line control voltage signal $VLF_{INV}(s)$.

In some embodiments, the voltage follower may include a first core amplifier (AMP) with rail-to-rail input and output connected as unit gain feedback. That is, the first core amplifier may have a negative unit gain feedback loop connected between an output of the AMP and an inverting input of the AMP so as to generate a unit gain.

In some embodiments, the inverting follower may comprise a second core amplifier (AMP) having a negative feedback loop formed with a feedback resistor $R_{fb}$ coupled between an output of the second amplifier and an inverting input of the second amplifier; and an input resistor $R_{in}$ coupled to the inverting input of the second amplifier. The feedback resistor $R_{fb}$ and the input resistor $R_{in}$ are set to have a same resistance (typically equal to 10 KΩ) so as to generate an inverting unit gain (i.e., an inverting gain close to 1).

In some embodiments, the SAR-ADC may include a comparator (CMP) with regeneration (RG) configured to receive the buffered delay-line control voltage signal $VLF_{Buf}(s)$ at a first input terminal; a SAR logic circuit coupled to an output of the comparator and configured to provide a digital output; and a digital-to-analog converter (DAC) (e.g., a R-2R DAC) configured to receive the digital output from the SAR logic circuitry, convert the digital output into the analog delay-line control voltage $VLF_{DAC}(s)$, and feedback the analog delay-line control voltage $VLF_{DAC}(s)$ into a second input terminal of the comparator. As such, upon receiving the enabling signal VENABLE from the lock detector, the SAR-ADC can start operation to detect, reproduce, and maintain the DC level of $VLF_{Buf}$ on the R-2R DAC as $VLF_{DAC}$, which can be designed to track $VLF_{DC}$ with an error less than 7 mV typically.

Figure 16:
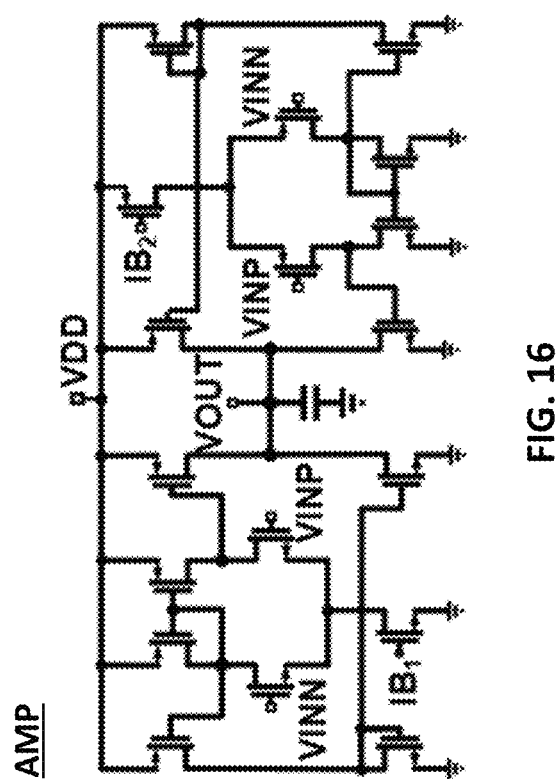
FIG. 16 shows an exemplary circuit diagram for a core amplifier (AMP) according to some embodiments of the present invention.

FIG. 16 shows an exemplary architecture of a 2-stage amplifier for implementing each of the first core AMP and second core AMP. As shown, the 2-stage amplifier may have PMOS and NMOS as input devices to support a rail-to-rail input and output ranges, which completely cover the $VLF_{DC}$ range, e.g., from 0.25 V to 0.85 V.

Figure 17A:
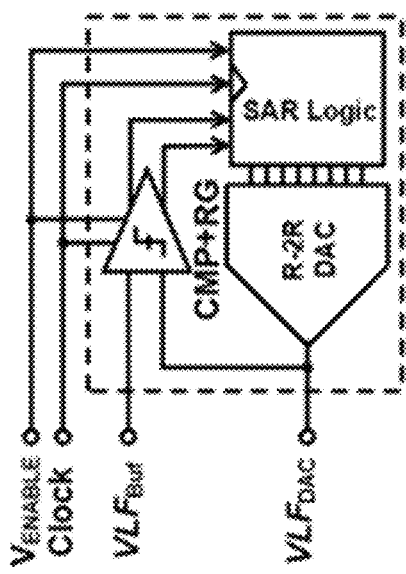
FIG. 17A shows an exemplary circuit diagram for a successive approximation register (SAR) analog-to-digital converter (ADC) according to some embodiments of the present invention.
Figure 17C:
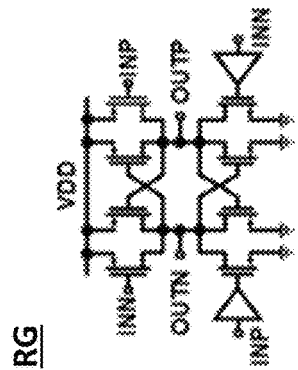
FIG. 17C shows an exemplary circuit diagram for a regeneration (RG) circuit according to some embodiments of the present invention.
Figure 17B:
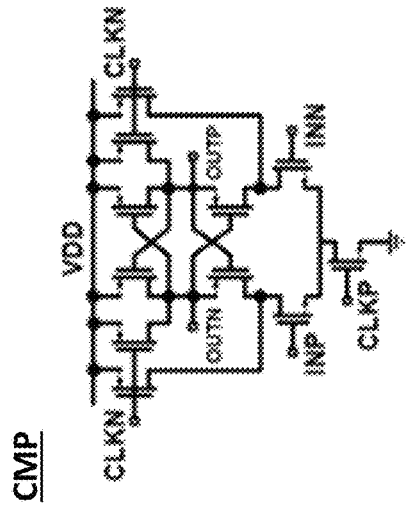
FIG. 17B shows an exemplary circuit diagram for a comparator (CMP) according to some embodiments of the present invention.

FIG. 17A shows an exemplary block diagram of an 8-bit SAR-ADC, consisting of a StrongARM comparator (CMP) as shown in FIG. 17B with a regeneration (RG) circuit as shown in FIG. 17C, an 8-bit SAR logic and an 8-bit R-2R ladder-based DAC.

Figure 17D:
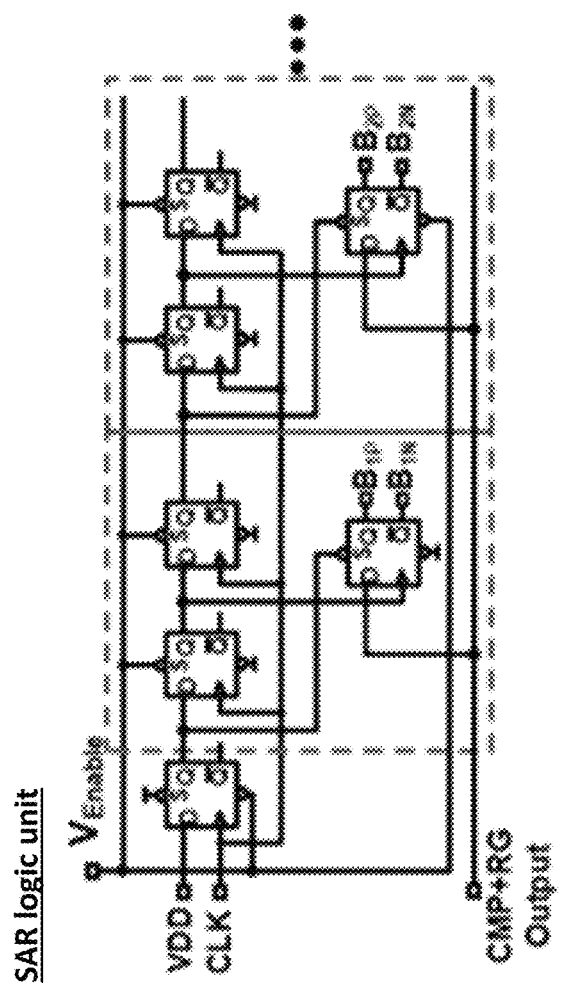
FIG. 17D shows an exemplary circuit diagram for a SAR logic unit according to some embodiments of the present invention.

The 8-bit SAR logic circuit consists of eight identical SAR logic units. As shown in FIG. 17D, each SAR logic unit contains two sequence-control D-Flip-Flops (SDFF) and one coding DFF (CDFF) to produce the switch control bit for the corresponding R-2R unit.

Figure 17E:
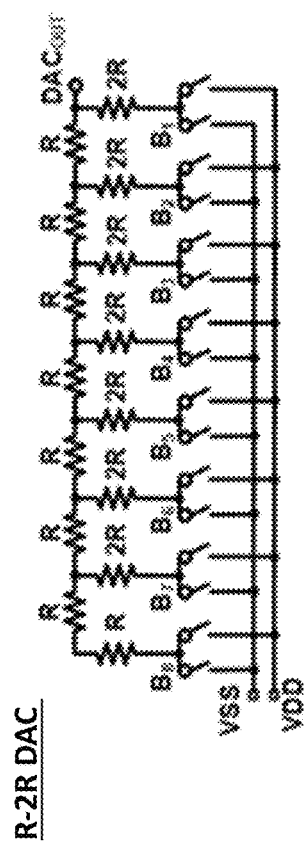
FIG. 17E shows an exemplary circuit diagram for a R-2R digital-to-analog converter (DAC) according to some embodiments of the present invention.

As shown in FIG. 17E, the R-2R DAC directly uses VDD and VSS as reference levels to cover the whole $VLF_{DC}$ range.

Figure 18:
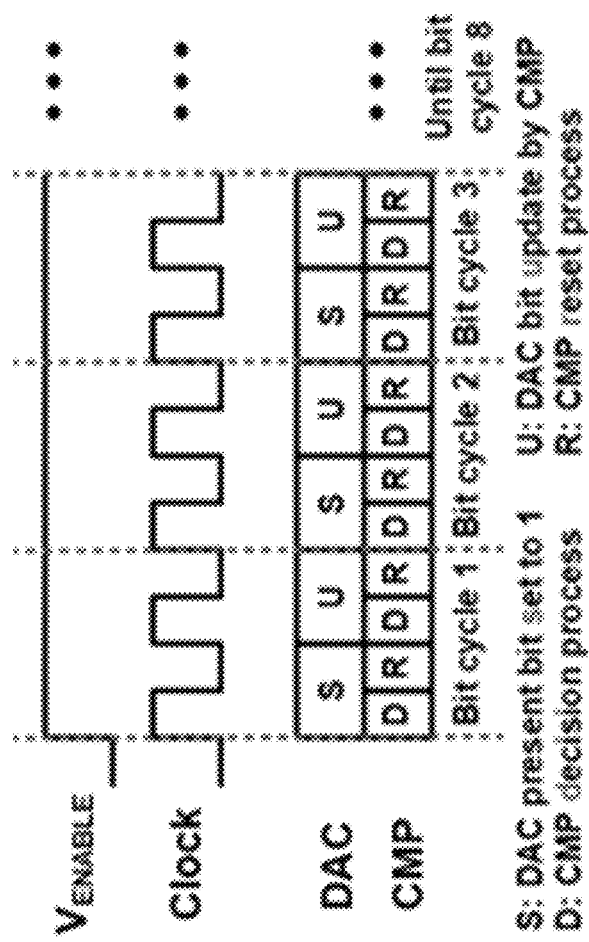
FIG. 18 shows a timing diagram of the operation process the SAR-ADC.

FIG. 18 shows a timing diagram of the operation process the 8-bit SAR ADC. The principle of the SAR ADC is to pre-set each DAC control bit to 1 as a predicted value successively, and then update the control bit after comparing the predicted value with the input. The operation of each SAR-ADC unit takes two clock cycles. In the first clock cycle, the CDFF sets (S) the R-2R unit control bit to 1 for prediction. The StrongARM CMP starts the comparison process at the clock rising edge, and is reset at the following clock falling edge. The return-to-zero (RZ) code produced by the CMP is converted into NRZ format by the RG circuit. In the second clock cycle, the CDFF output is updated (U) with the CMP comparison result.

Referring back to FIG. 14. The plurality of C-VCDL circuits may include: a first C-VCDL circuit configured to compensate, based on the inverted delay-line control voltage signal $VLF_{INV}(s)$, an input jitter transferred to the recovered clock signals ($CLK_{REC}$) to generate the jitter-compensated recovered clock signal ($CLK_{RECJC}$); and a second C-VCDL circuit configured to compensate, based on the inverted delay-line control voltage signal $VLF_{INV}(s)$, an input jitter transferred to the recovered LSB data signal ($LSB_{REC}$) to generate the jitter-compensated recovered LSB signal ($LSB_{RECJC}$); and a third C-VCDL circuit configured to compensate, based on the inverted delay-line control voltage signal $VLF_{INV}(s)$, an input jitter transferred to the recovered MSB data signal ($MSB_{REC}$) to generate the jitter-compensated recovered MSB signal ($MSB_{RECJC}$).

Figure 20:
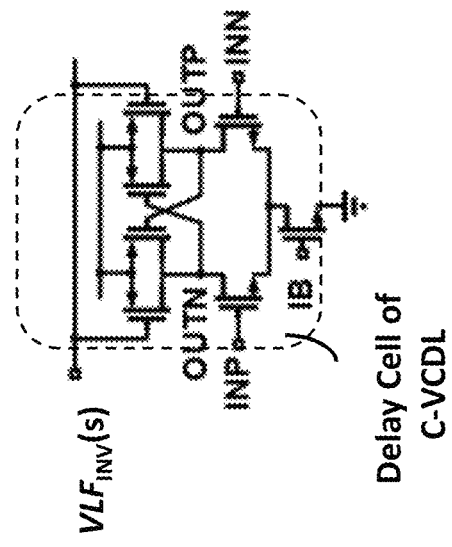
FIG. 20 shows an exemplary circuit diagram for a complementary voltage-controlled delay cell according to some embodiments of the present invention.
Figure 19:
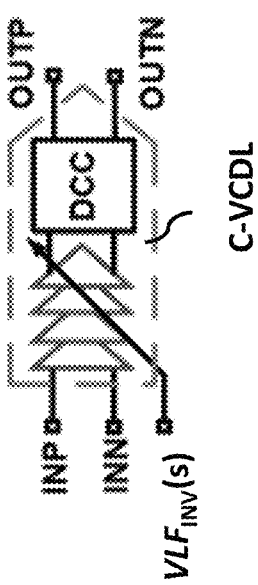
FIG. 19 shows an exemplary circuit diagram for a complementary VCDL (C-VCDL) circuit according to some embodiments of the present invention.

Referring to FIG. 19, in some embodiments, each C-VCDL circuit may include one or more complementary voltage-controlled delay cells. Referring to FIG. 20, each complementary voltage-controlled delay cell consists of a pair of NMOSs as input devices and a pair of PMOSs as output devices to generate a delayed output signal having a delay time proportional to the inverted delay-line control voltage signal $VLF_{INV}(s)$ with reference to the input clock signal $CLK_{IN}$.

In other words, the first C-VCDL circuit may include one or more complementary voltage-controlled delay cells for the jitter-compensated recovered clock signal $CLK_{RECJC}$ which has a delay time proportional to the inverted delay-line control voltage signal $VLF_{INV}(s)$ with reference to the input clock signal $CLK_{IN}$.

The second C-VCDL circuit may include one or more complementary voltage-controlled delay cells for generating the jitter-compensated recovered LSB signal $LSB_{RECJC}$ which has a delay time proportional to the inverted delay-line control voltage signal $VLF_{INV}(s)$ with reference to the input clock signal $CLK_{IN}$.

The third C-VCDL circuit may include one or more complementary voltage-controlled delay cells for generating the jitter-compensated recovered MSB signal $MSB_{RECJC}$ which has a delay time proportional to the inverted delay-line control voltage signal $VLF_{INV}(s)$ with reference to the input clock signal $CLK_{IN}$.

Figure 21:
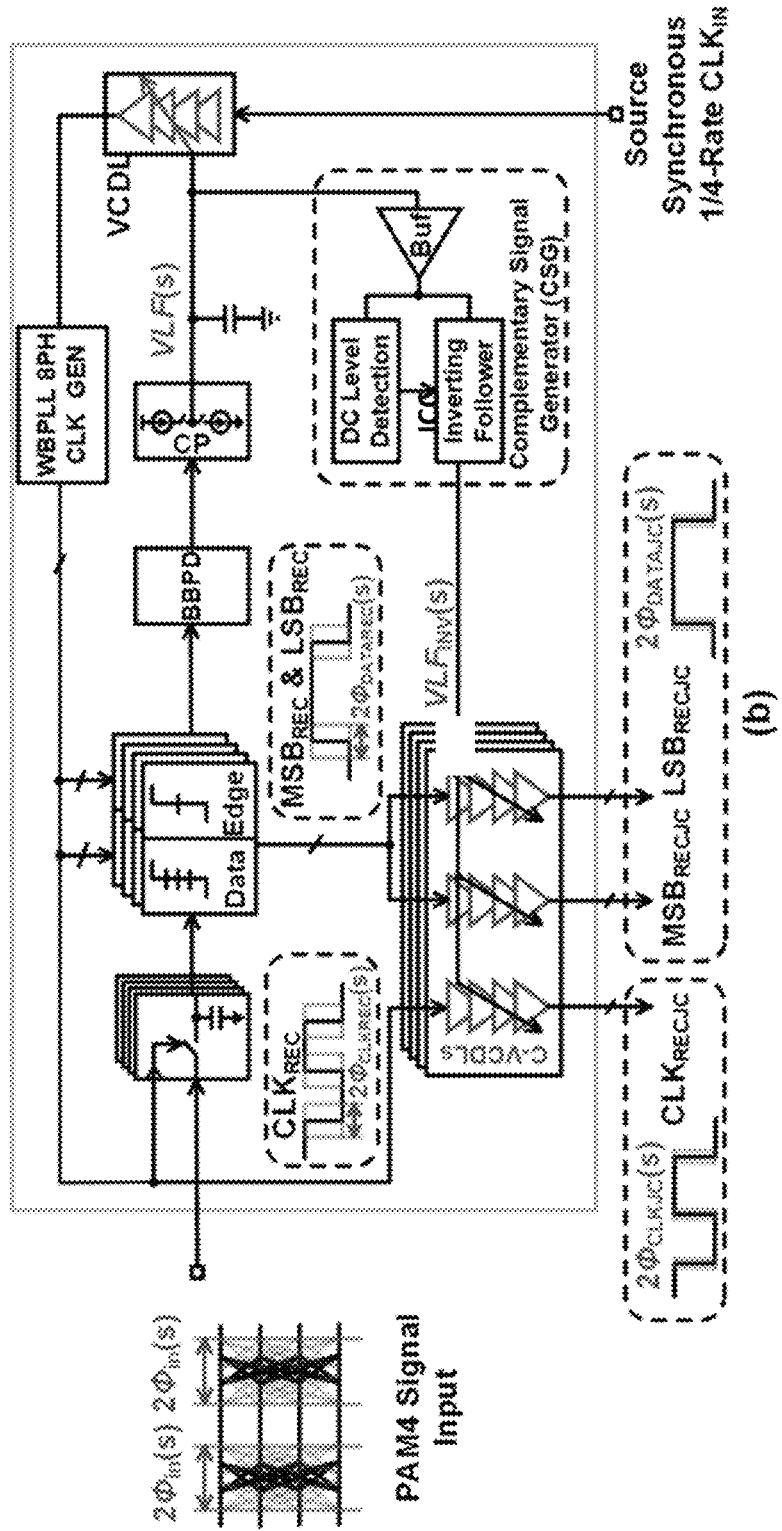
FIG. 21 shows an exemplary JCCDR architecture supporting ¼-rate PAM-4 operation according to some embodiments of the present invention.

FIG. 21 shows an exemplary JCCDR architecture supporting ¼-rate PAM-4 operation according to some embodiments of the present invention. As shown in FIG. 21, a first-order DLL tracks the jitter on the input PAM-4 signal using a PAM-4 BBPD, a charge pump (CP), a loop filter (not shown), and a VCDL. The VCDL is controlled by VLF(s) to generate the ¼-rate $CLK_{DLL}$, which carries a jitter almost identical to input PAM-4 signal. A second-order 400-MHz WBPLL uses the $CLK_{DLL}$ as reference to produce the 8-phase (PH-0/45 . . . /270/315) clocks, denoted as $CLK_{REC}$, for the PAM-4 signal decoding. The 400-MHz WBPLL bandwidth ensures fast frequency and phase update, which does not affect the DLL dynamics. The recovered 8-PH $CLK_{REC}$ synchronize the PAM-4 decoder to generate the recovered most significant bit ($MSB_{REC}$) and least significant bit ($LSB_{REC}$). A jitter compensation circuit (JCC) consisting of a complementary signal generator (CSG) and VCDL replicas is used to attenuate the jitter transfers on $CLK_{REC}$, $MSB_{REC}$ and $LSB_{REC}$. The CSG yields an inverted loop filter voltage $VLF_{INV}(s)$ for controlling the VCDL replicas to create the C-VCDL. The $VLF_{INV}(s)$ is designed to have the same amplitude but inverted phase as VLF(s). The $CLK_{REC}$, $MSB_{REC}$, and $LSB_{REC}$ are fed to the C-VCDLs controlled by $VLF_{INV}(s)$ to negate the jitter transfer, and deliver the jitter-compensated outputs $CLK_{RECJC}$, $MSB_{RECJC}$, and $LSB_{RECJC}$, which theoretically carry no transferred jitters from the input PAM-4 signal. Therefore, the undesirable jitter transfer can be attenuated.

The principle of jitter compensation can also be illustrated using loop dynamic analysis. The close loop transfer function (CLTF) of jitter transferred from input data to the DLL can be derived as:

$$H_{VLF}(s) = \frac{VLS(s)}{\phi_{in}(s)} = \frac{R_T K_{BBPD} K_{CP} \frac{1}{sC}}{1 + R_T K_{BBPD} K_{CP} \frac{1}{sC}}, \quad (1)$$

where $\Phi_{in}(s)$ stands for the input jitter, $R_T$ stands for transition ratio (typically equal to 0.5). $K_e$ and $K_{CP}$ represents the gains of the BBPD and charge pump (CP). The effect of WBPLL is not include since its loop bandwidth is ten times higher than the DLL.

The CLTF from $\Phi_{in}(s)$ to the recovered clock phase $\Phi_{CLKREC}(s)$ can be represented by:

$$H_{\phi_{CLKREC}}(s) = \frac{\phi_{CLKREC}(s)}{\phi_{in}(s)} = \frac{R_T K_{BBPD} K_{CP} K_{VCDL} \frac{1}{sC}}{1 + R_T K_{BBPD} K_{CP} K_{VCDL} \frac{1}{sC}}, \quad (2)$$

where $K_{VCDL}$ represents the gain of the VCDL circuit.

Eq. (2) illustrates the jitter transfer behavior of the DLL. The 3-dB bandwidth of Eq (2) determines the jitter tolerance bandwidth defined as:

$$\text{Jitter Tolerance Bandwidth} = \frac{R_T K_{BBPD} K_{CP} K_{VCDL}}{C}, \quad (3)$$

The CLTF from $\Phi_{in}(s)$ to the phase of jitter compensated clock $\Phi_{CLKRECJC}(s)$ can be determined by:

$$H_{\phi_{CLKRECJC}}(s) = \frac{\phi_{CLKREC}(s) + \phi_{in}(s) H_{VLF}(s) K_{CSG}(s) K_{VCDL}}{\phi_{in}(s)} \quad (4)$$

$$\approx \frac{R_T K_{BBPD} K_{CP} \frac{1}{sC}}{1 + R_T K_{BBPD} K_{CP} K_{VCDL} \frac{1}{sC}} \times (K_{VCDL} + K_{CSG}(s) K_{PV} K_{VCDL}),$$

where $K_{CSG}$ represents the gain of the CSG circuit and $K_{PV}$ represents the gain induced by process variation.

Ideally, $K_{CSG}$ is equal to $-1$ to generate an $VLF_{INV}(s)$ signal with completely the same amplitude and inverted phase as VLF(s) such that complete jitter transfer compensation can be achieved. However, two non-ideal factors deviate KCSG from $-1$, including the AC gain errors in voltage follower and inverting follower, and the DC offset between $VLF_{DC}$ and $VLF_{INVDC}$. Therefore, $K_{CSG}$ can be represented as:

$$K_{CSG} = K_{ACgain} K_{DCoffset} \quad (6)$$

wherein $K_{ACgain}$ is the AC gain of voltage follower and inverting voltage follower and $K_{DCoffset}$ is the DC offset gain of the voltage follower and SAR ADC in the CSG circuit.

The DC offset gain may be calculated using the equation:

$$K_{DCoffset} = \frac{K_{VCDL}(VLF_{DC} + DCoffset)}{K_{VCDL}(VLF_{DC})} \quad (7)$$

where $K_{VCDL}(VLF_{DC})$ represents the $K_{VCDL}$ value at $V_{LFDC}$.

As described previously, the function of CSG is to produce the $VLF_{INV}(s)$ with the same amplitude and inverted phase as VLF. The mismatch factor between $K_{VCDL}$ and $K_{CVCDL}$ due to local process variation is included in $K_{PV}$, which is close to 1 with fully symmetry layout.

Figure 22:
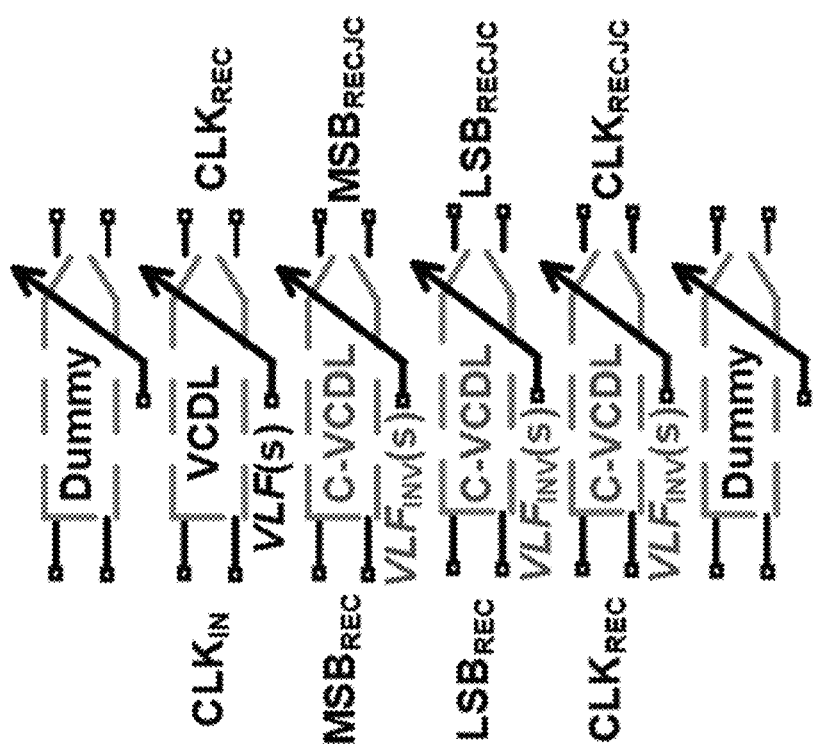
FIG. 22 shows an exemplary circuit diagram for a VCDL and a group of three C-VCDLs with two dummies for improving the layout matching according to some embodiments of the present invention.

In real CMOS implementation, the offset and gain error in CSG, and the mismatch between VCDL and C-VCDL due to process variation can degrade the jitter transfer compensation performance. In order to ensure better matching, the VCDL and C-VCDL circuits are aligned close to each other, and protected by dummies at both ends in circuit layout as shown in FIG. 22. The VCDL is composed of a number (e.g., four as depicted) of single voltage-controlled delay cells and a duty cycle correction (DCC) block. Each delay cell consists of a pair of NMOSs as input devices and a pair of PMOSs controlled by VLF(s) or $VLF_{INV}(s)$ to determine the delay time. A cross coupled PMOS pair is used to correct the duty cycle. The delay cell with current source transfers less supply variation into output jitter.

The embodiments were chosen and described in order to best explain the principles of the invention and its practical application, thereby enabling others skilled in the art to understand the invention for various embodiments and with various modifications that are suited to the particular use contemplated. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. A four-level pulse amplitude modulation (PAM-4) receiver with jitter compensation clock and data recovery, comprising:
  a continuous-time linear equalizer configured to equalize an input data signal;
  a wide-band phase-locked loop (WBPLL) configured to lock to a quarter-rate delay-locked clock signal to generate a plurality of sampling clock signals with evenly separated phases, the plurality of sampling clock signals including N data-sampling clock signals with phases separated by 360°/N and N/2 edge-sampling clock signals with phases separated by 360°/(N/2) and interleaving with the N data-sampling clock signals, where N is a positive even integer;
  a data decoder configured to decode the equalized data signal with the N data-sampling clock signals to recover a most significant bit (MSB) signal and a least significant bit (LSB) signal;

an edge detector configured to detect edge information of the equalized data signal with the N/2 edge-sampling clock signals to generate an edge information signal;

a retimer circuit configured to synchronize the recovered MSB signal, the recovered LSB signal and the edge information signal;

a delay-locked loop (DLL) configured to: detect a phase skew of the input signal with reference to the sampling clock signals, produce a delay-line control voltage signal based on the detected phase skew, and generate a delay-locked clock signal based on the delay-line control voltage signal; and a jitter compensation circuit (JCC) configured to: compensate jitter transfer from the input data signal with a complementary delay-line control voltage signal to generate a jitter-compensated recovered clock signal, a jitter-compensated recovered LSB signal and a jitter-compensated recovered MSB signal.

2. The PAM-4 receiver according to claim 1, wherein the continuous-time linear equalizer has a R-C source degeneration and inductor shunt peaking architecture including a differential shunting peaking inductor L, a pair of drain resistors $R_D$, a degeneration capacitor Cs and a degeneration resistor Rs.

3. The PAM-4 receiver according to claim 1, wherein the WBPLL comprises:
a voltage-controlled oscillator (VCO) configured to generate the plurality of sampling clock signals based on an oscillator control voltage signal;
a phase frequency detector configured to detect a phase difference of the generated sampling clock signals with reference to the delay-locked clock signal, and produce a phase difference signal; and
a charge pump and a loop filter configured to convert the phase difference signal to the oscillator control voltage signal.

4. The PAM-4 receiver according to claim 3, wherein the VCO is a ring oscillator including one or more delay cells and a current source for frequency control.

5. The PAM-4 receiver according to claim 1, wherein the data decoder comprises:
N sample-and-hold circuits configured to sample the equalized data signal with the N data-sampling clock signals to obtain N data samples respectively;
a 3-level slicer circuit configured to demodulate each of the N data samples into a thermometer coded bit stream by comparing each of the N data samples with three decision threshold voltage levels;
a coding converter configured to convert the thermometer coded bit stream to a binary coded bit stream including a MSB bit stream constituting the recovered MSB signal and a LSB bit stream constituting the recovered LSB signal.

6. The PAM-4 receiver according to claim 5, wherein the data decoder further comprises a digital-to-analog converter (DAC) configured to generate the three decision threshold voltage levels.

7. The PAM-4 receiver according to claim 5, wherein data decoder further comprises a calibration circuit configured to calibrate voltage offsets at the input data signal.

8. The PAM-4 receiver according to claim 1, wherein the edge detector comprises:
N/2 sample-and-hold circuit configured to sample edges on the equalized data signal with the N/2 edge-sampling clock signals to obtain N/2 edge information samples; and a comparator configured to generate the edge information signals by comparing each of the N/2 edge information samples with a decision threshold voltage level.

9. The PAM-4 receiver according to claim 1, wherein the DLL comprises:
a bang-bang phase detector (BBPD) configured to detect the phase skew of the input signal with reference to the sampling clock signals to generate a phase skew signal;
a charge pump and a loop filter configured to convert the phase skew signal to the delay-line control voltage signal;
a voltage-controlled delay line (VCDL) circuit configured to generate the delay-locked clock signal based on the delay-line control voltage signal and an input clock signal.

10. The PAM-4 receiver according to claim 9, wherein the DLL further comprises a buffer circuit and duty cycle correction (DCC) circuit configured to correct duty cycles of the input clock signal and convert the input clock signal from a single-ended clock signal to a differential clock signal.

11. The PAM-4 receiver according to claim 9, wherein the VCDL circuit comprises:
one or more voltage-controlled delay cells, each consists of a pair of NMOSs as input devices and a pair of PMOSs as output devices to produce a delayed output signal having a delay time proportional to the delay-line control voltage signal with reference to the input clock signal.

12. The PAM-4 receiver according to claim 1, wherein the JCC comprises:
a complementary signal generator (CSG) configured to convert the delay-line control voltage signal to an inverted delay-line control voltage signal; and
a plurality of complementary VCDL (C-VCDL) circuits including:
a first C-VCDL circuit configured to compensate, based on the complementary delay-line control voltage signal, an input jitter transferred to the recovered clock signals to generate the jitter-compensated recovered clock signal;
a second C-VCDL circuit configured to compensate, based on the inverted delay-line control voltage signal, an input jitter transferred to the recovered LSB data signal to generate the jitter-compensated recovered LSB signal; and
a third C-VCDL circuit configured to compensate, based on the inverted delay-line control voltage signal, an input jitter to the recovered MSB data signal to generate a jitter-compensated recovered MSB signal.

13. The PAM-4 receiver according to claim 12, wherein the CSG comprises:
a clock control unit configured to divide a control clock signal and use the divided control clock signal for synchronization;
a voltage follower configured to produce a buffered delay-line control voltage signal;
a successive approximation register (SAR) analog-to-digital converter (ADC) synchronized with the divided control clock signal and configured to quantize the buffered delay-line control voltage signal to obtain a DC level and produce an analog delay-line control voltage for tracking the DC level; and an inverting follower configured to receive the delay-line control voltage signal and the analog delay-line control voltage to produce the inverted delay-line control voltage signal.

14. The PAM-4 receiver according to claim 13, wherein the voltage follower comprises a first amplifier having a negative unit gain feedback loop connected between an output of the first amplifier and an inverting input of the first amplifier so as to generate a unit gain.

15. The PAM-4 receiver according to claim 13, wherein the inverting follower comprises;
    a second amplifier having a negative feedback loop including a feedback resistor $R_{fb}$ coupled between an output of the second amplifier and an inverting input of the second amplifier; and
    an input resistor $R_{in}$ coupled to the inverting input of the second amplifier;
    wherein the feedback resistor $R_{fb}$ and the input resistor $R_{in}$ are set to have a same resistance so as to generate an inverting unit gain.

16. The PAM-4 receiver according to claim 13, wherein the SAR-ADC comprises:
    a comparator configured to receive the buffered delay-line control voltage signal at a first input terminal;
    a SAR logic circuit coupled to an output of the comparator and configured to provide a digital output; and
    a digital-to-analog converter (DAC) configured to receive the digital output from the logic circuitry, convert the digital output into the analog delay-line control voltage, and feedback the analog delay-line control voltage into a second input terminal of the comparator.

17. The PAM-4 receiver according to claim 12, wherein each of the first, second and third C-VCDL circuits comprises one or more complementary voltage-controlled delay cells; each complementary voltage-controlled delay cell consists of a pair of NMOSs as input devices and a pair of PMOSs as output devices to generate a delayed output signal having a delay time proportional to the inverted delay-line control voltage signal with reference to the input clock signal.

* * * * *